(12) United States Patent  (10) Patent No.: US 8,084,323 B2
Nieh  (45) Date of Patent: Dec. 27, 2011

(54) STACK CAPACITOR OF MEMORY DEVICE AND FABRICATION METHOD THEREOF

(75) Inventor: Shin-Yu Nieh, Taoyuan County (TW)

(73) Assignee: Nanya Technology Corporation, Taoyuan (TW)

( * ) Notice: Subject to any disclaimer, the term of this patent is extended or adjusted under 35 U.S.C. 154(b) by 141 days.

(21) Appl. No.: 12/640,846

(22) Filed: Dec. 17, 2009

(65) Prior Publication Data

US 2011/0147887 A1  Jun. 23, 2011

(51) Int. Cl.
*H01L 21/8242* (2006.01)
(52) U.S. Cl. .................. 438/253; 438/254; 438/397
(58) Field of Classification Search .......... 438/253, 438/254, 255, 396, 397, 398; 257/E21.648
See application file for complete search history.

(56) References Cited

U.S. PATENT DOCUMENTS 7,459,745 B2 * 12/2008 Lee et al. ................ 257/303

* cited by examiner

*Primary Examiner* — Hoai V Pham

(57) ABSTRACT

The invention provides a method for forming a stack capacitor of a memory device, including providing a substrate, forming a patterned sacrificial layer with a plurality of first openings over the substrate, conformally forming a first conductive layer on the patterned sacrificial layer and in the first openings, forming a second conductive layer on the first conductive layer to seal the first openings with a void formed therein, removing a portion of the first and second conductive layers to expose the patterned sacrificial layer, and removing at least a portion of the patterned sacrificial layer to form bottom cell plates.

15 Claims, 23 Drawing Sheets

STACK CAPACITOR OF MEMORY DEVICE AND FABRICATION METHOD THEREOF

BACKGROUND OF THE INVENTION

1. Field of the Invention

This invention relates generally to a method for forming a semiconductor device and more particularly relates to a method for forming capacitors of a memory device.

2. Description of the Related Art

As DRAMs increase in memory cell density, there is a continuing challenge to maintain sufficiently high storage capacitance despite decreasing cell area. Additionally, there is a continuing goal to further decrease cell area. The principal way for increasing cell capacitance is through cell structure techniques. Such techniques include three-dimensional cell capacitors, such as trenched or stacked capacitors. Moreover, the container structure can be classified as cylinder type or pedestal type structure. This invention concerns stacked capacitor cell constructions, including, what are commonly known as pedestal container stacked capacitors.

BRIEF SUMMARY OF INVENTION

The invention provides a method for forming a stack capacitor of a memory device, comprising providing a substrate, forming a patterned sacrificial layer with a plurality of first openings over the substrate, conformally forming a first conductive layer on the patterned sacrificial layer and in the first openings, forming a second conductive layer on the first conductive layer to seal the first openings with a void formed therein, removing a portion of the first and second conductive layers to expose the patterned sacrificial layer, and removing at least a portion of the patterned sacrificial layer to form bottom cell plates.

The invention further provides a stack capacitor of a memory device, comprising a bottom cell plate including a void therein, wherein a top portion and a side portion of the bottom cell plate are formed of different depositions method such that the top portion and the side portion of the bottom cell plate have different orientations, a capacitor dielectric layer on the bottom cell plate, and a top cell plate on the capacitor dielectric layer.

BRIEF DESCRIPTION OF DRAWINGS

The invention can be more fully understood by reading the subsequent detailed description and examples with references made to the accompanying drawings, wherein.

FIG. 3G shows a cross section along line A-A' of FIG. 4.

FIG. 3H shows a cross section along line B-B' of FIG. 4.

FIG. 3I shows a cross section along line A-A' of FIG. 5.

FIG. 3J shows a cross section along line B-B' of FIG. 5.

DETAILED DESCRIPTION OF INVENTION

Figure 1A:
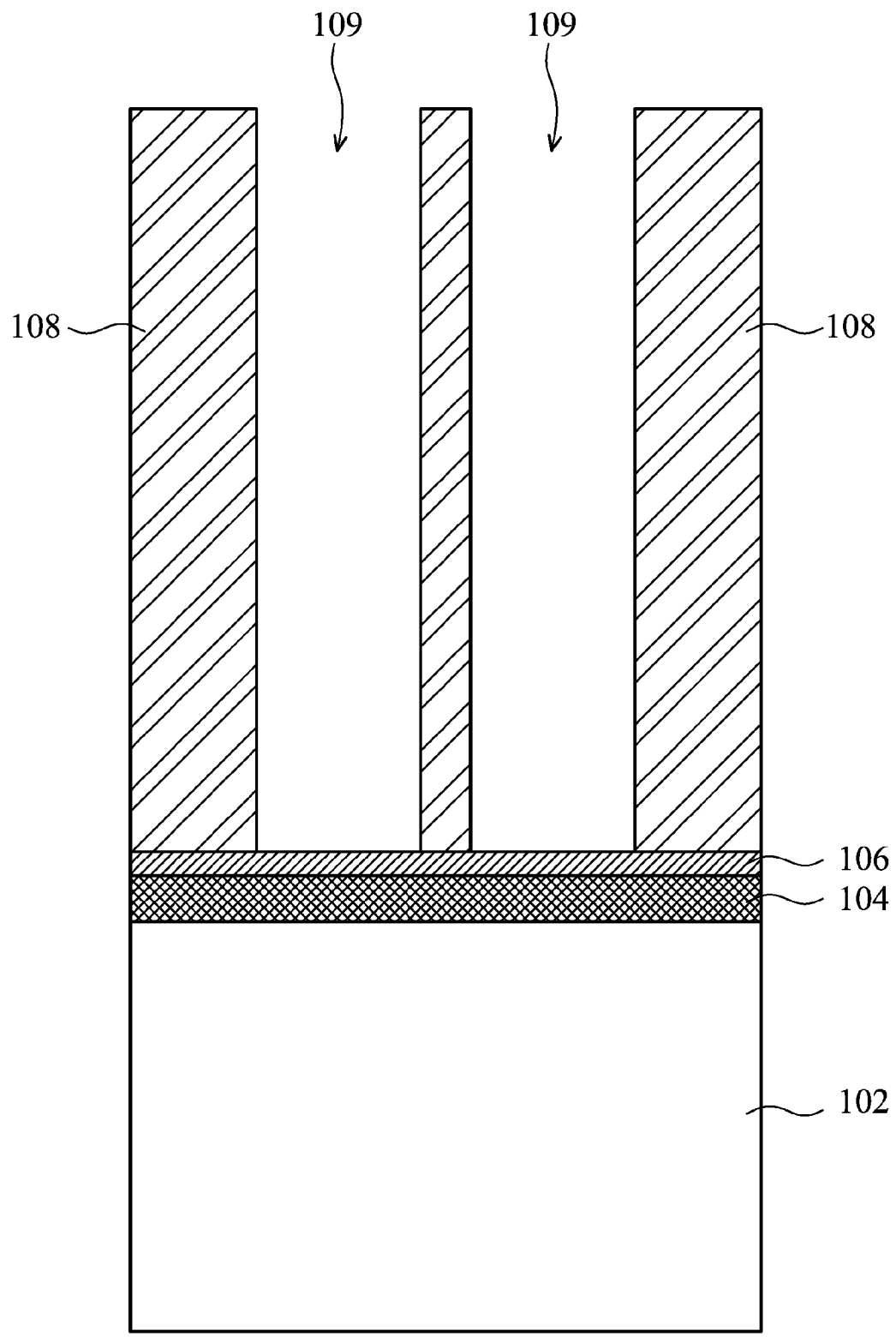
FIG. 1A to FIG. 1D show a method for forming bottom cell plates of capacitors of a memory device.
Figure 1B:
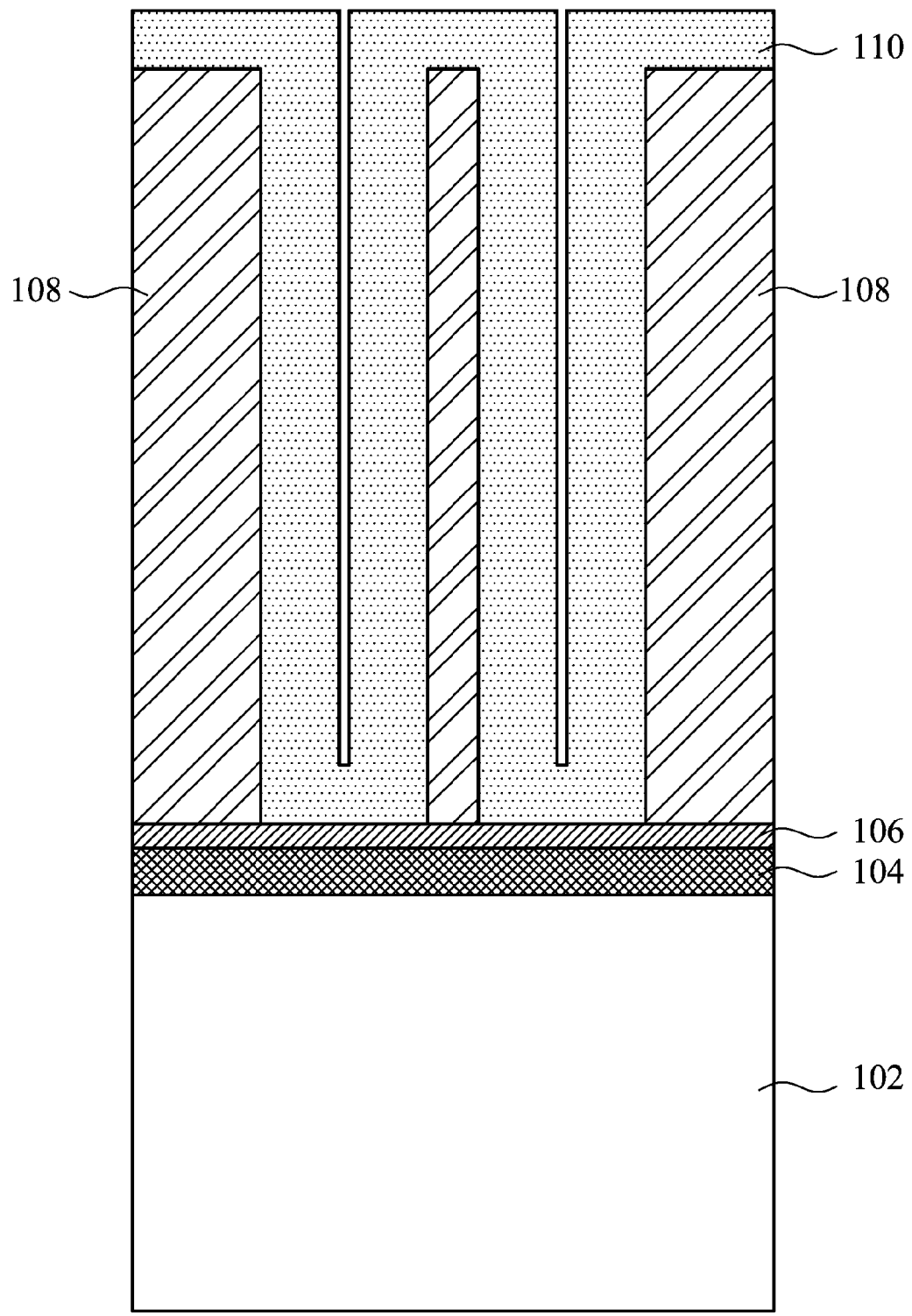
Figure 1C:
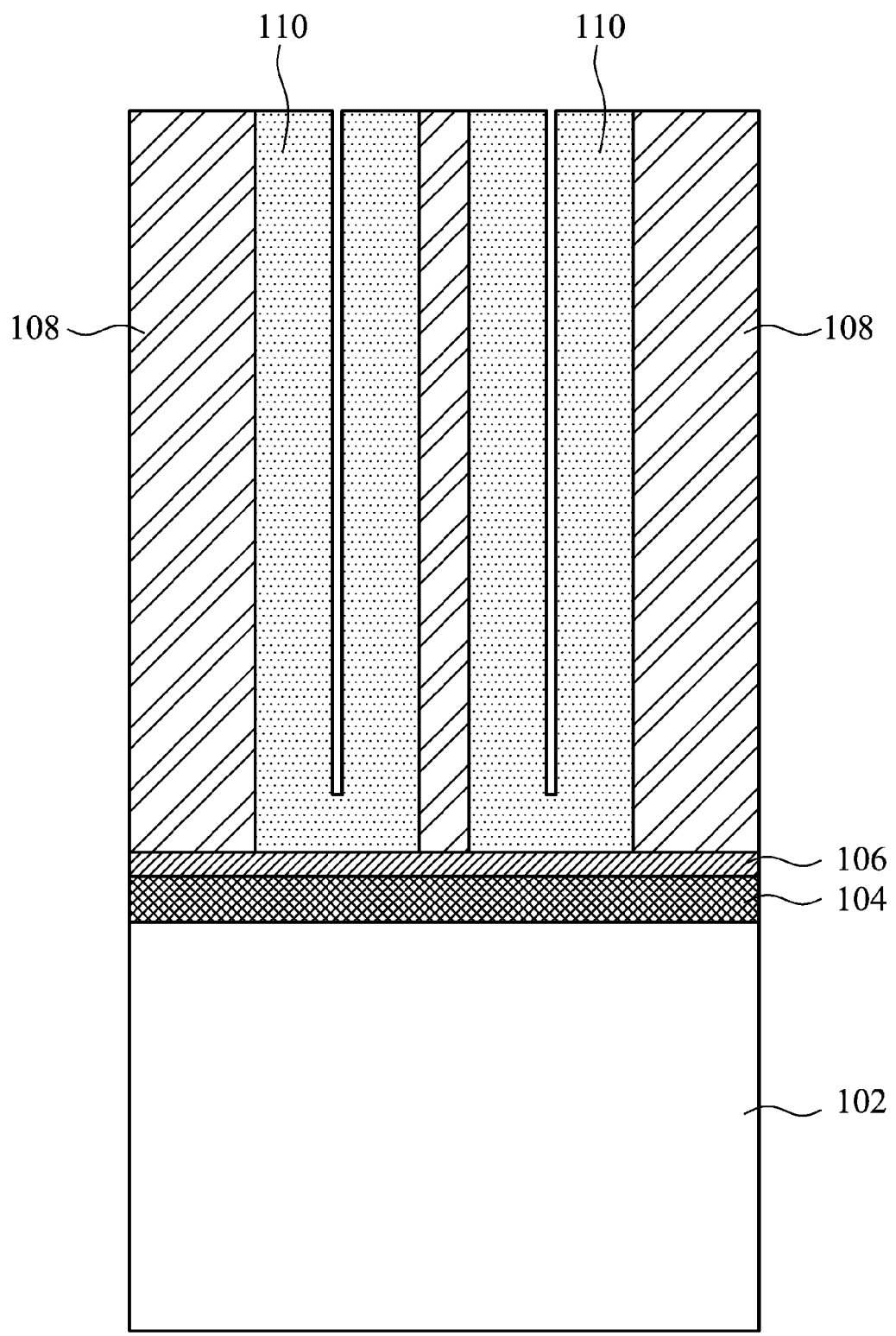
Figure 1D:
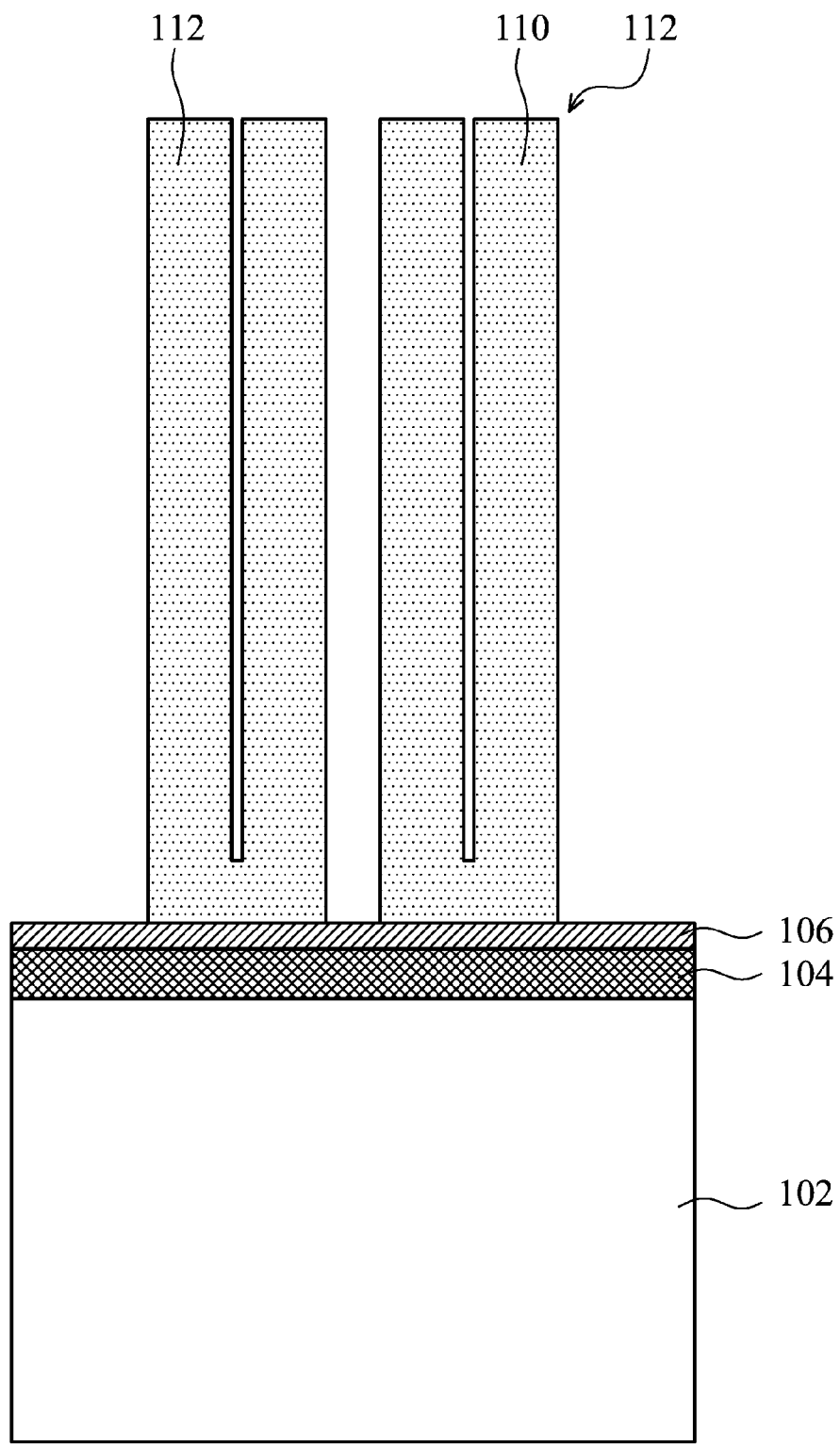

FIG. 1A to FIG. 1D show cross sections for forming bottom cell plates of capacitors of a memory device. Following a description of the FIGs, problems found in the fabrication method will be highlighted. Referring to FIG. 1A, a substrate 102 is provided. An oxide layer 104 and a nitride layer 106 are formed on the substrate 102. A patterned sacrificial oxide layer 108 with a plurality of openings 109 are formed on the nitride layer 106. Referring to FIG. 1B, a TiN layer 110 is formed on the patterned sacrificial oxide layer 108 and filled into the openings 109 by atomic layer deposition. Note that the deposited TiN layer 110 is required to have a thickness greater than ½ F (feature) for forming bottom cell plates. Referring to FIG. 1C, a metal chemical mechanical polishing (CMP) process is performed to remove a portion of the TiN layer 110 exceeding the patterned sacrificial oxide layer 108, such that the patterned sacrificial oxide layer 108 and the TiN layer 110 may form a planar surface. Referring to FIG. 1D, the patterned sacrificial oxide layer 108 is removed by an etching back process to form a plurality of cylindrical bottom cell plates 112. As described, the TiN layer 110 is required to be thick. However, a thick TiN layer 110 causes wafer bow issues, increases costs, and lowers throughput.

Figure 2A:
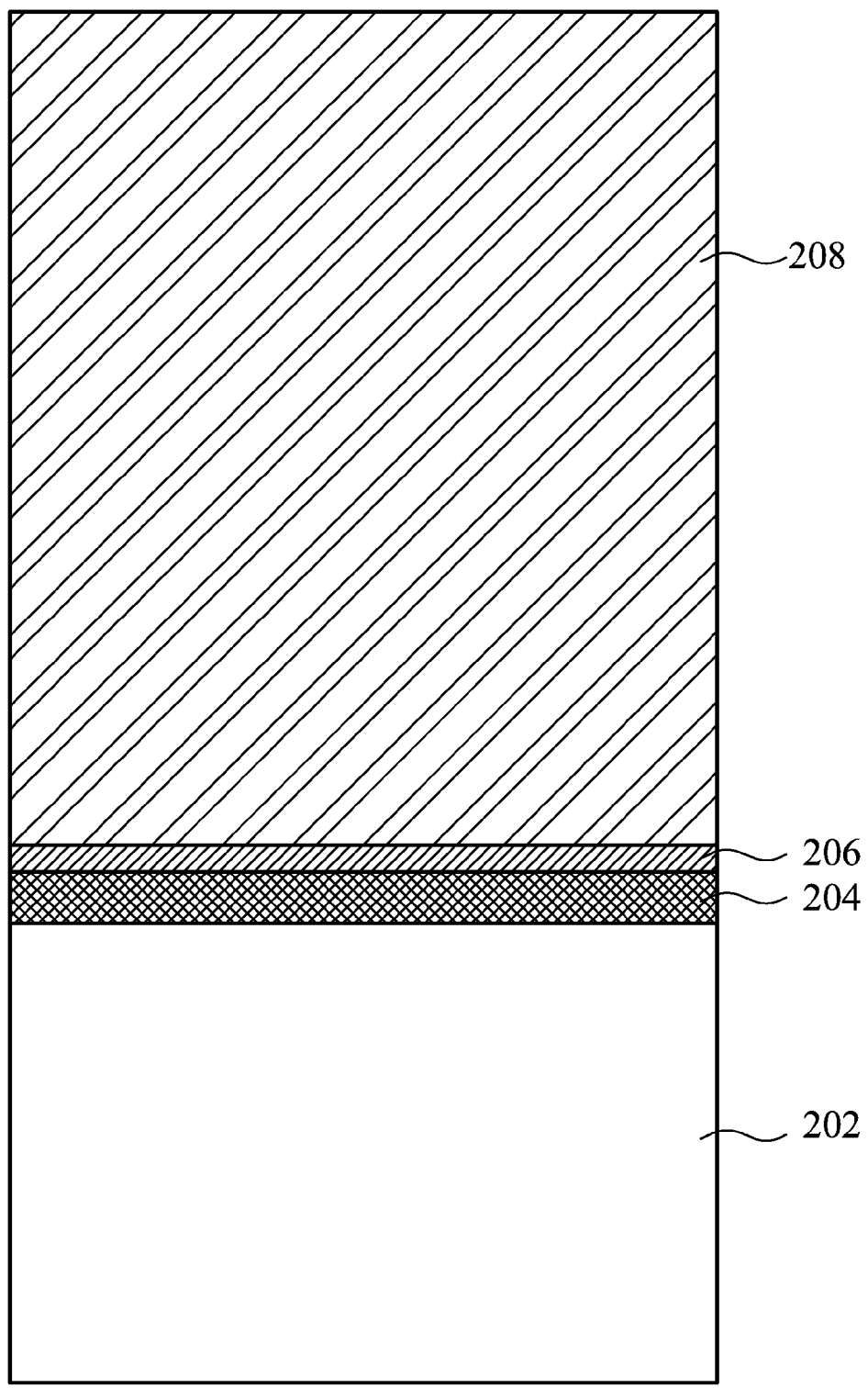
FIG. 2A~FIG. 2G show a method for forming stacked capacitors of a memory device of an embodiment of the invention.
Figure 2B:
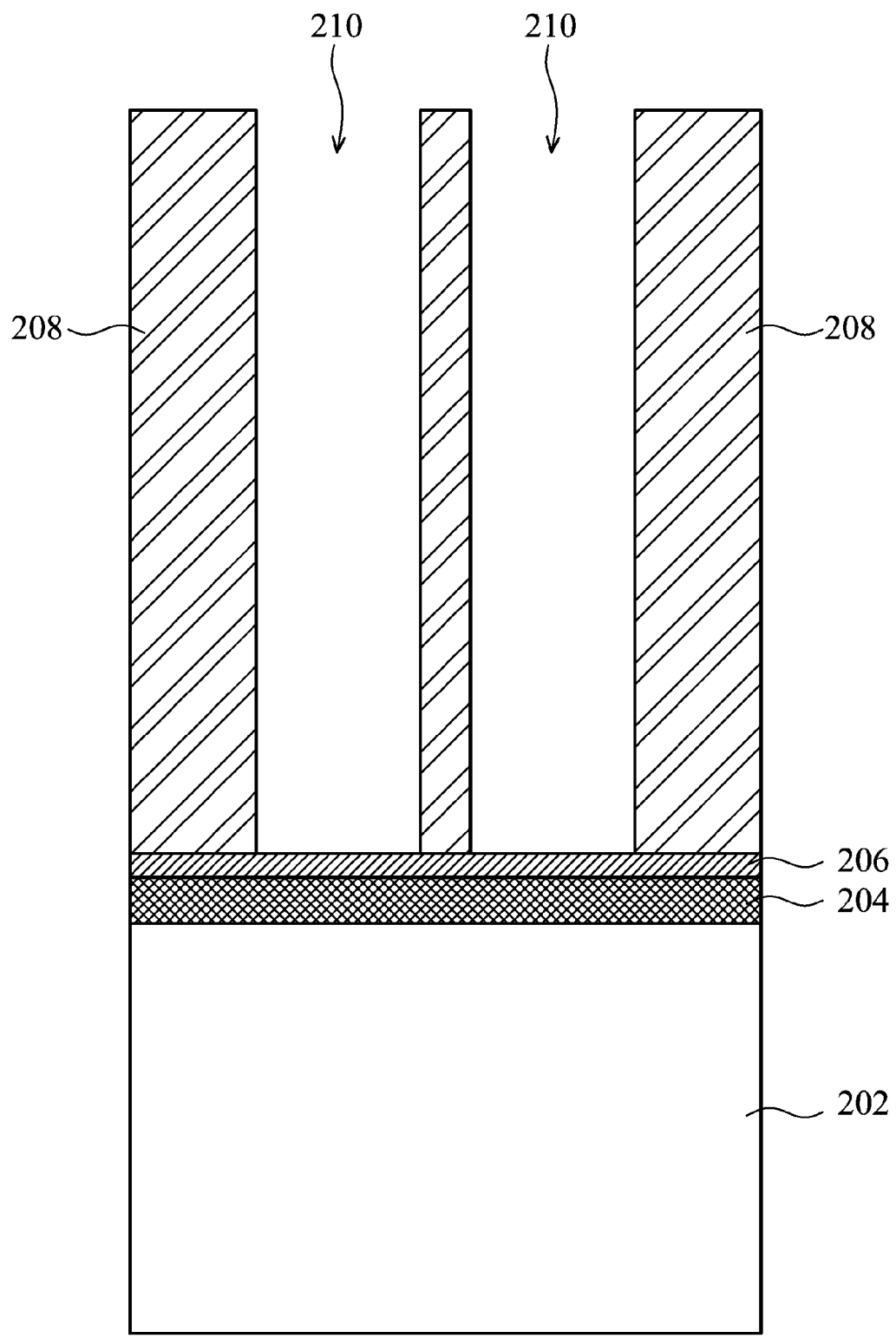
Figure 2C:
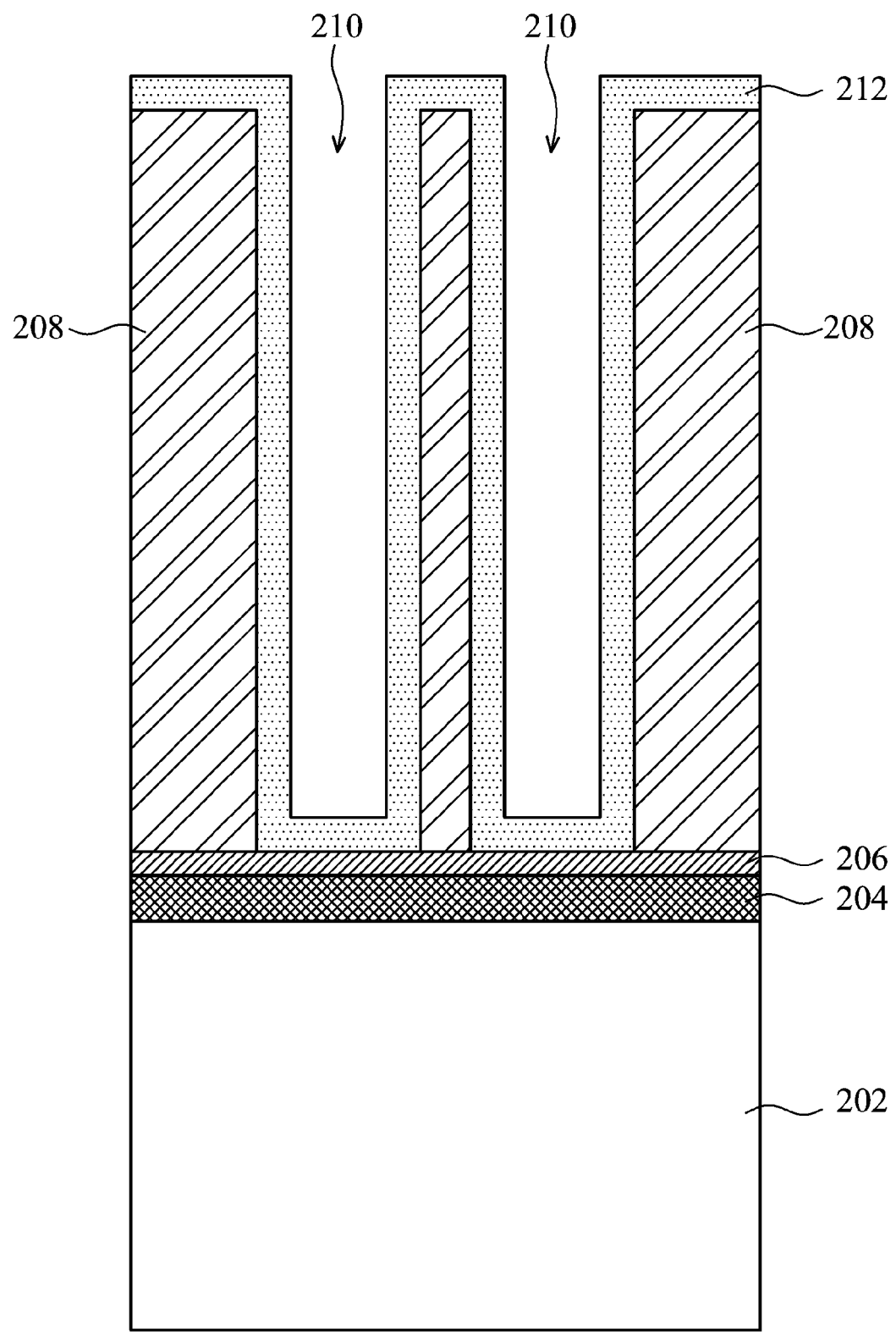
Figure 2D:
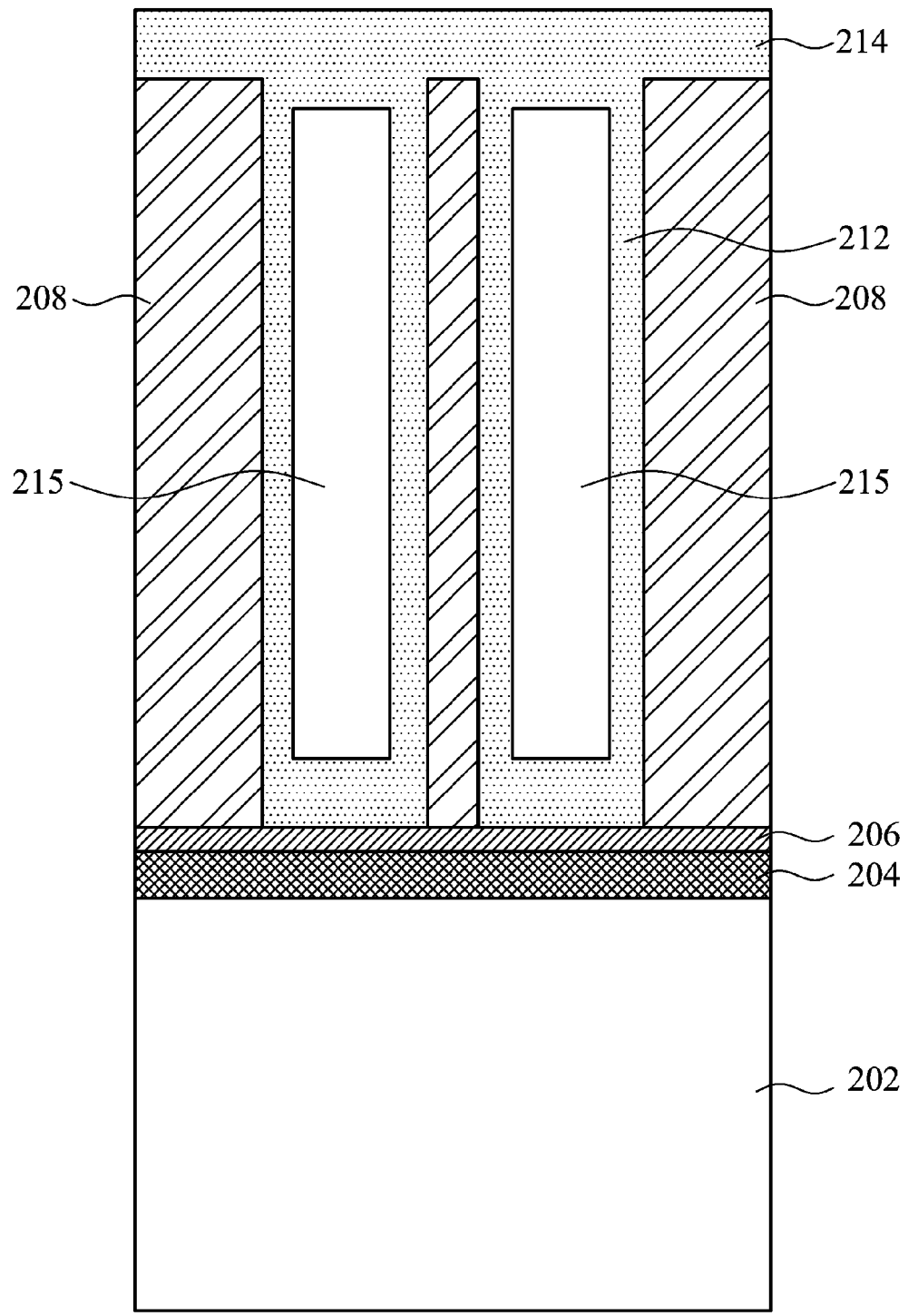
Figure 2E:
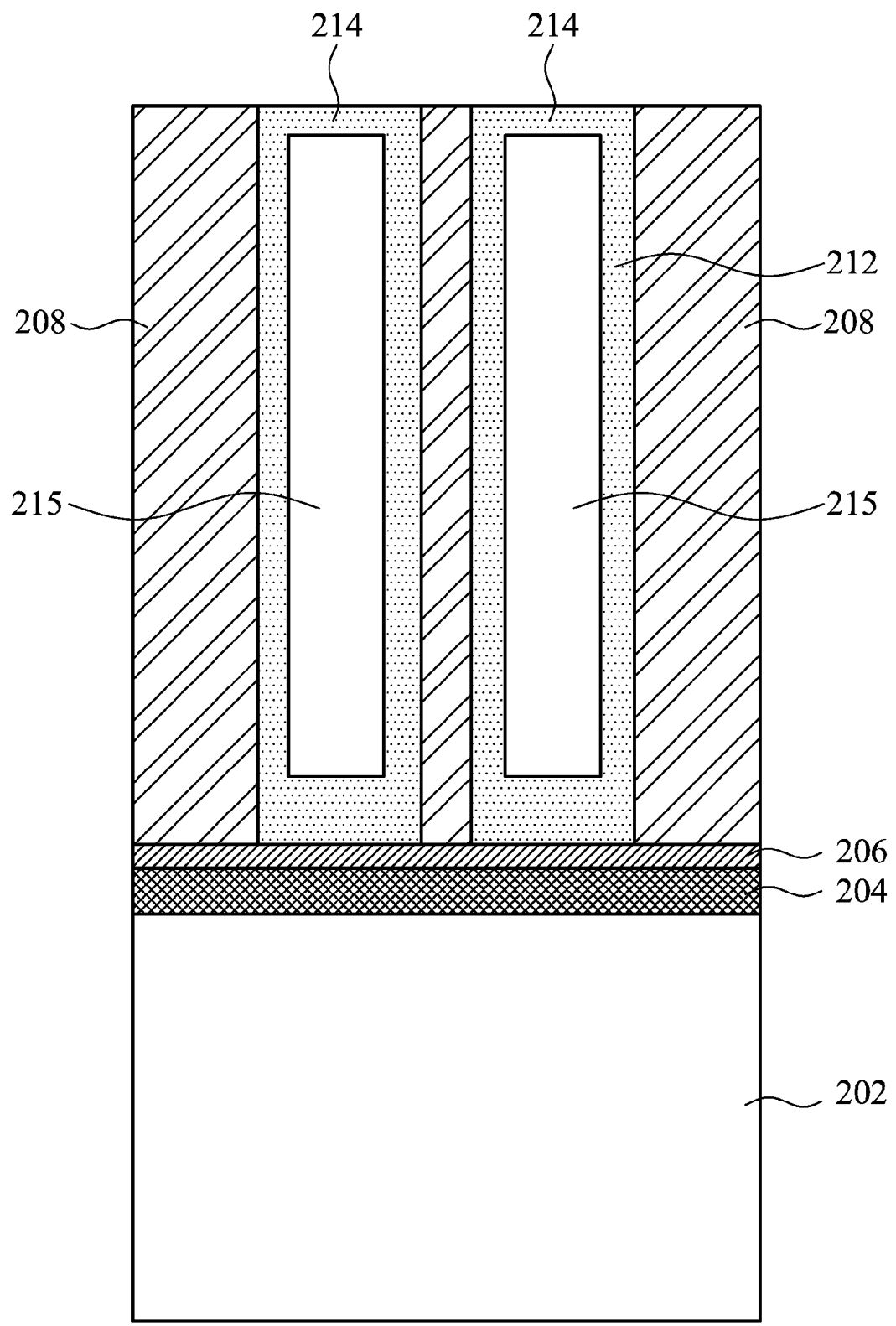
Figure 2F:
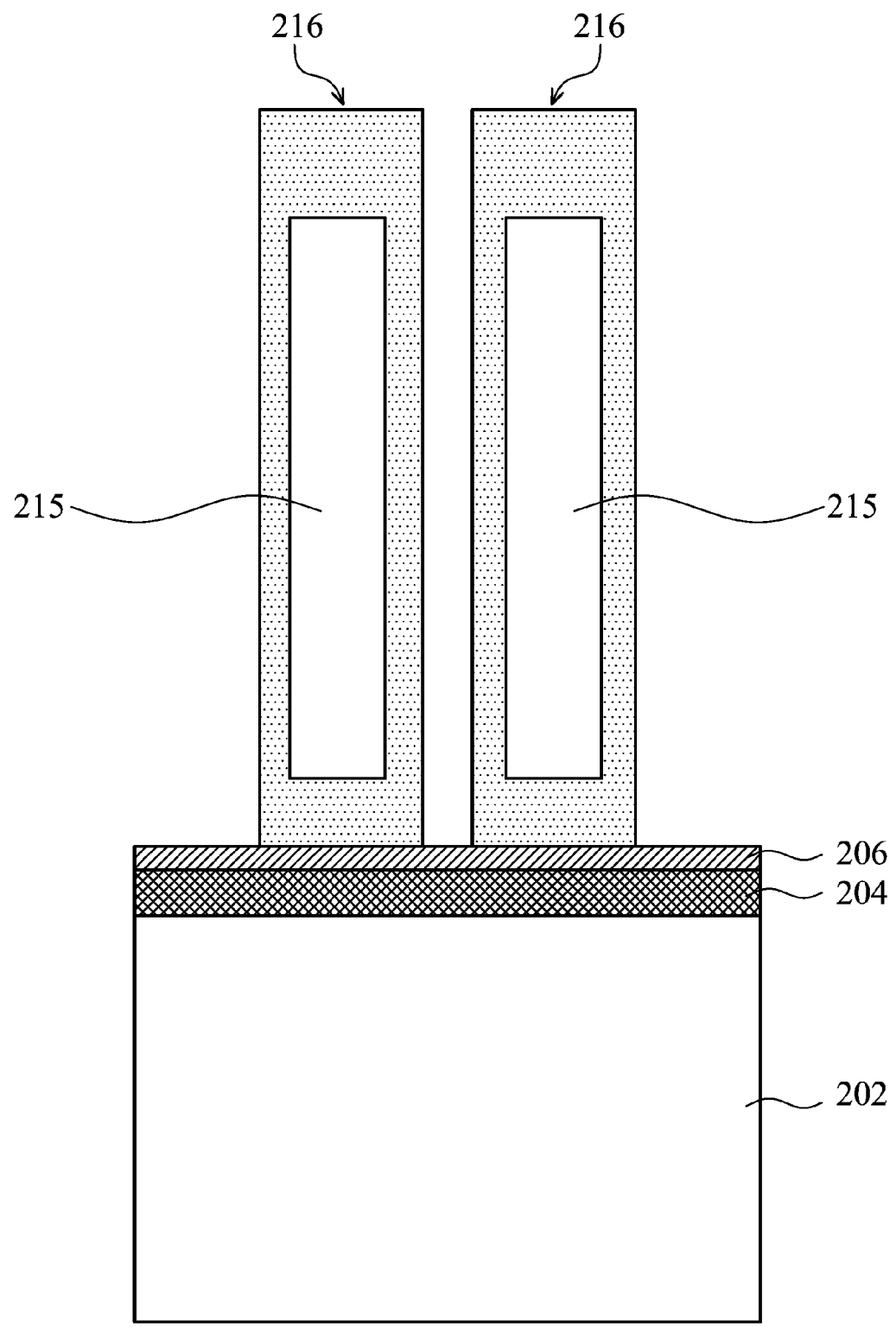
Figure 2G:
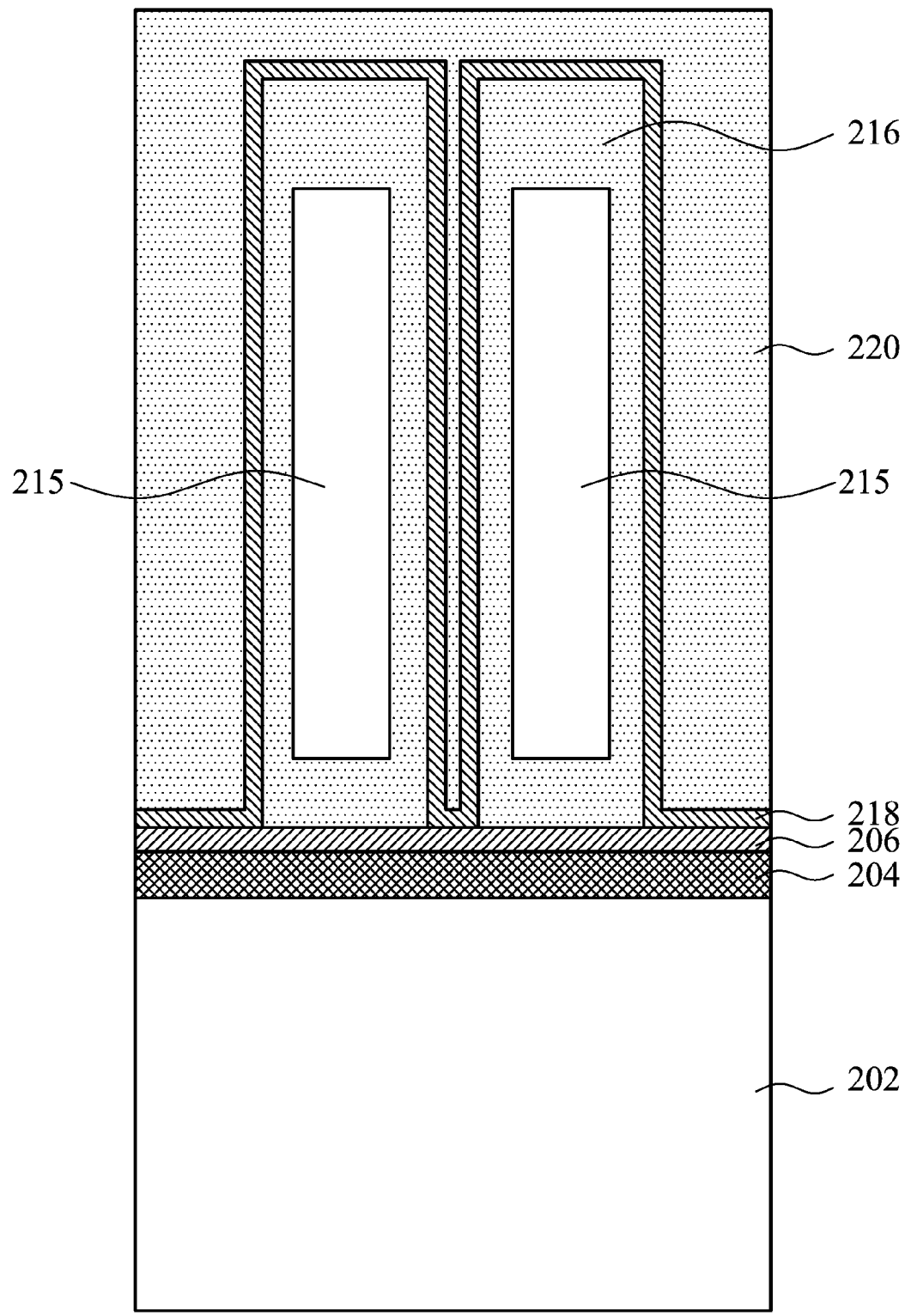

Accordingly, a novel method for forming stacked capacitors of a memory device will be described in accordance with FIG. 2A~FIG. 2G. First, referring to FIG. 2A, a substrate 202 is provided. In the embodiment, the substrate 202 can be a semiconductor substrate, for example comprising bulk silicon, polysilicon or silicon on insulator (SOI). Preferably, the substrate is a silicon substrate. A first dielectric layer 204, preferably a silicon oxide layer, is formed on the substrate 202. A second dielectric layer 206, preferably a silicon nitride layer, is formed on the first dielectric layer 204. A sacrificial layer 208, preferably a silicon oxide layer, is formed on the second dielectric layer 206. The first dielectric layer 204, the second dielectric layer 206 and the sacrificial layer 208 may be formed by chemical vapor deposition. Referring to FIG. 2B, the sacrificial layer 208 is patterned by lithography and etching to form a plurality of openings 210. Note that the sacrificial layer 208 preferably has high etching selectivity with the second dielectric layer 206 such that the etching process for forming the openings 210 is stopped at the second dielectric layer 206. The following paragraph describes formation of a container. Referring to FIG. 2C, a first conductive layer 212 is conformally formed on the sacrificial layer 208 and in the openings 210. The first conductive layer 212 preferably comprising TiN, Ru and W, is thin, such as 8~10 nm thickness, and may be formed by atomic layer deposition. Following, as an important feature of the embodiment, as shown in FIG. 2D, a second conductive layer 214 is deposited on the first conductive layer 212 to seal the openings 210. The second conductive layer 214 is preferably formed by a deposition method. In this manner, the deposited film may gather at the top portion and the bottom portion of the openings 210 of the sacrificial layer to seal the openings 210. In the embodiment, the second conductive layer 214 is preferably formed by physical vapor deposition. Also, preferably, pressure is in the range of 0.1 to 10 mTorr, temperature is in the range of 25 to 250 degree C. and power is in the range of 200 to 6000 W. As shown in FIG. 2D, since the openings 210 are sealed by the second conductive layer 214, a void 215 is formed corresponding to each opening 210. Also, since the first conductive layer 212 and the second conductive layer 214 are deposited by different deposition methods, the two films have different orientations. Referring to FIG. 2E, a CMP process is performed to remove a portion of the first conductive layer 212 and the second conductive layer 214 exceeding the sacrificial layer 208. Thus, the top surface of the sacrificial layer 208 is exposed. Thereafter, referring to FIG. 2F, the sacrificial layer 208 is removed to form the bottom cell plates 216. Because the sacrificial layer 208 comprises silicon oxide, the sacrificial layer 208 can be removed by dipping in a solution containing HF. Referring to FIG. 2G, a capacitor dielectric layer 218 is formed on the bottom cell plate. The capacitor dielectric layer may comprise silicon oxide, silicon nitride, silicon oxynitride, or high-K (for example, K>8) dielectric materials. Preferably, the capacitor dielectric layer comprises high-K dielectric material. The high-K dielectric material may comprise metal oxides, metal silicates, metal nitrides, transition metal-oxides, transition metal silicates, metal aluminates, and transition metal nitrides, or combinations thereof. For example, the high-K dielectric material may comprise, but is not limited to, one or more of aluminum oxide ($Al_2O_3$), hafnium oxide ($HfO_2$), hafnium oxynitride (HfON), hafnium silicate ($HfSiO_4$), zirconium oxide ($ZrO_2$), zirconium oxynitride (ZrON), zirconium silicate ($ZrSiO_2$), yttrium oxide ($Y_2O_3$), lanthanum oxide ($La_2O_3$), cerium oxide ($CeO_2$), titanium oxide ($TiO_2$), tantalum oxide ($Ta_2O_5$), or combinations thereof. Next, a third conductive layer 220, preferably comprising TiN, Ru or W, is formed on the capacitor dielectric layer 218 to form a top cell plate. Therefore, completing formation of a stacked capacitor cell of a memory device. Because the embodiment uses two deposition steps to form two conductive films when forming the bottom cell plates, a thick conductive layer for forming bottom cell plates is not required to be deposited. Accordingly, wafer bow problems are eliminated and stress related to issues, such as overlay or alignment failure issues, can be reduced. Moreover, the embodiment can have a higher throughput and lower cost.

Figure 3A:
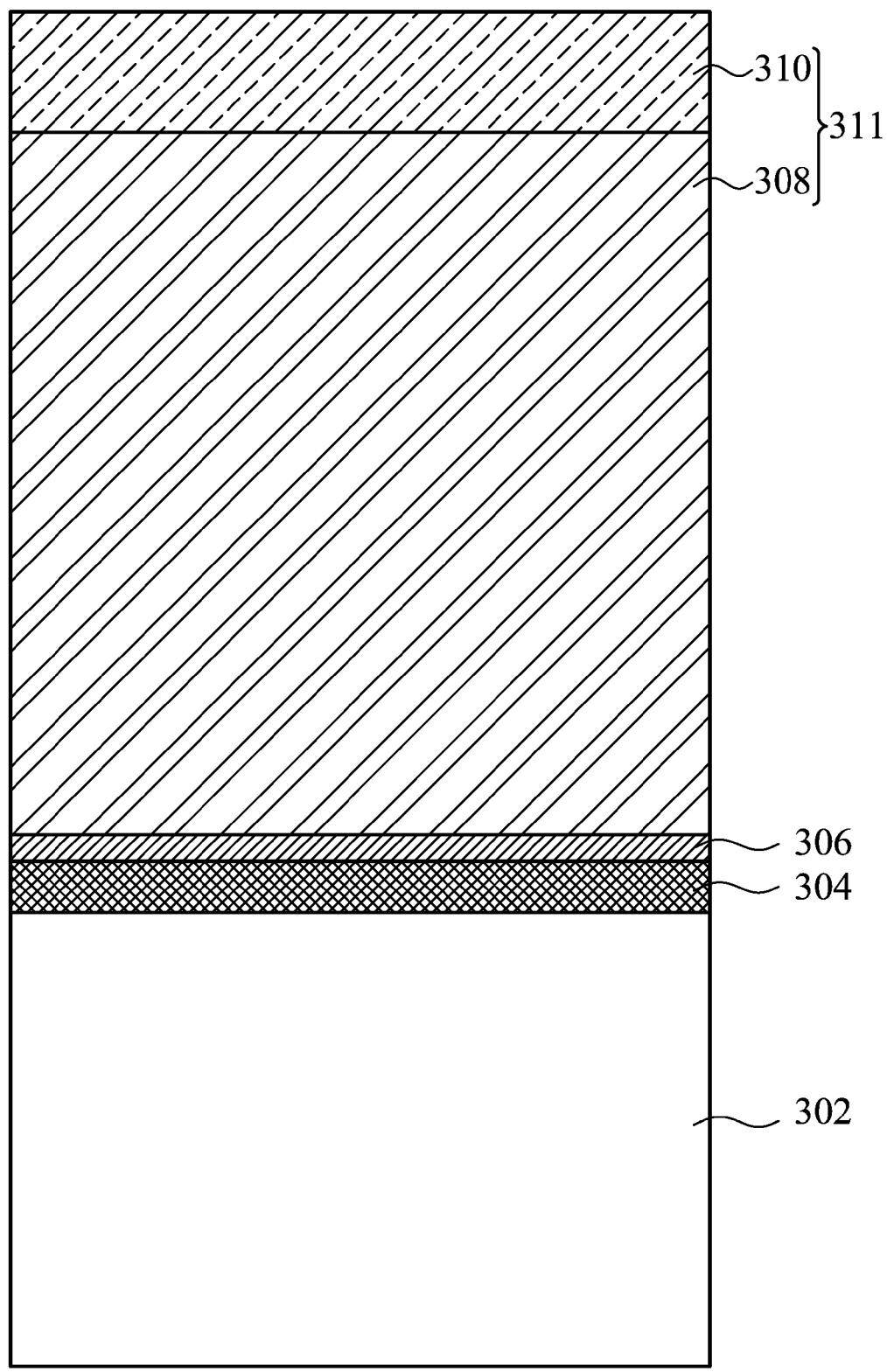
FIG. 3A~FIG. 3J show a method for forming stacked capacitors of a memory device of another embodiment of the invention.
Figure 3B:
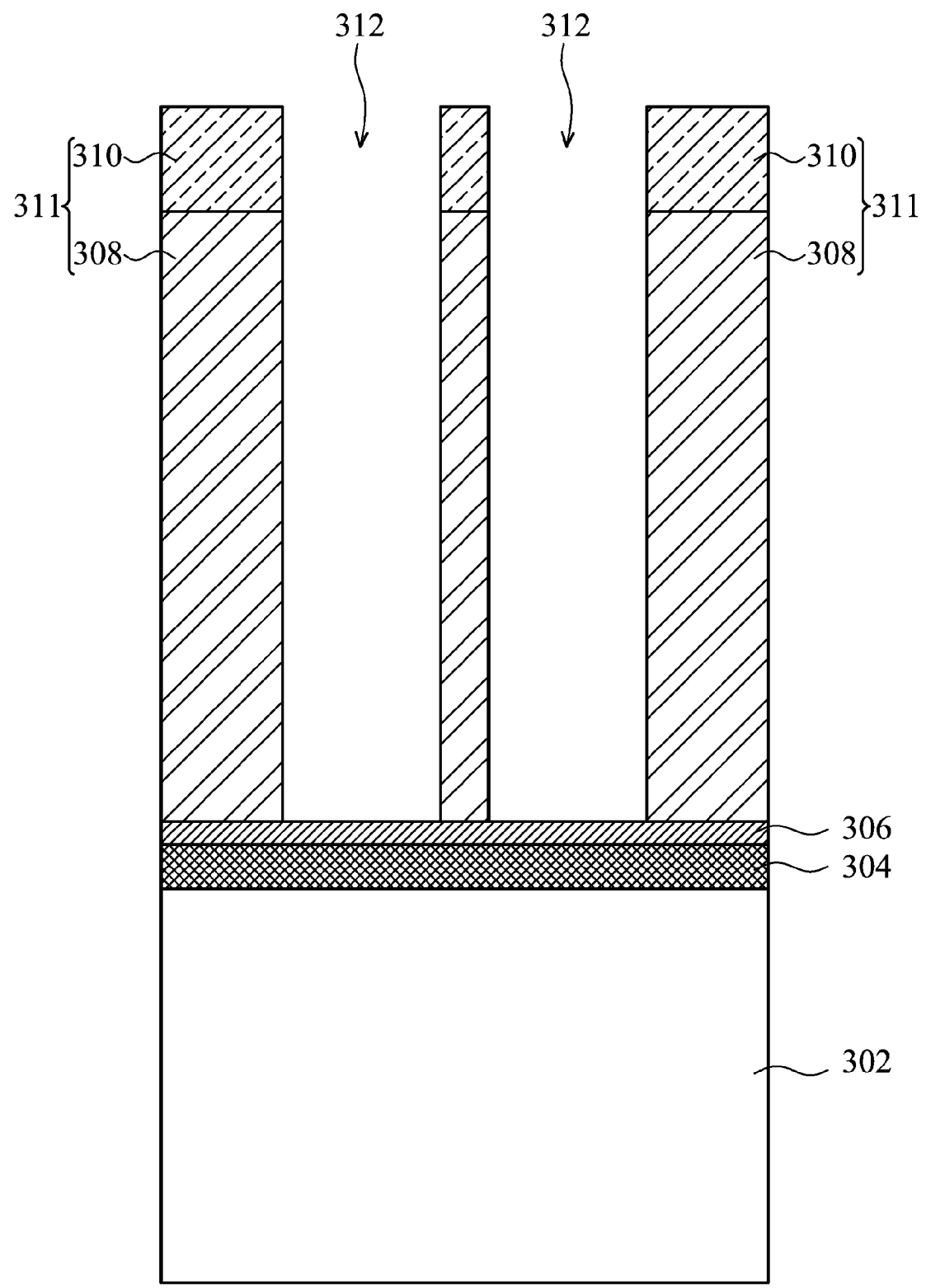
Figure 3C:
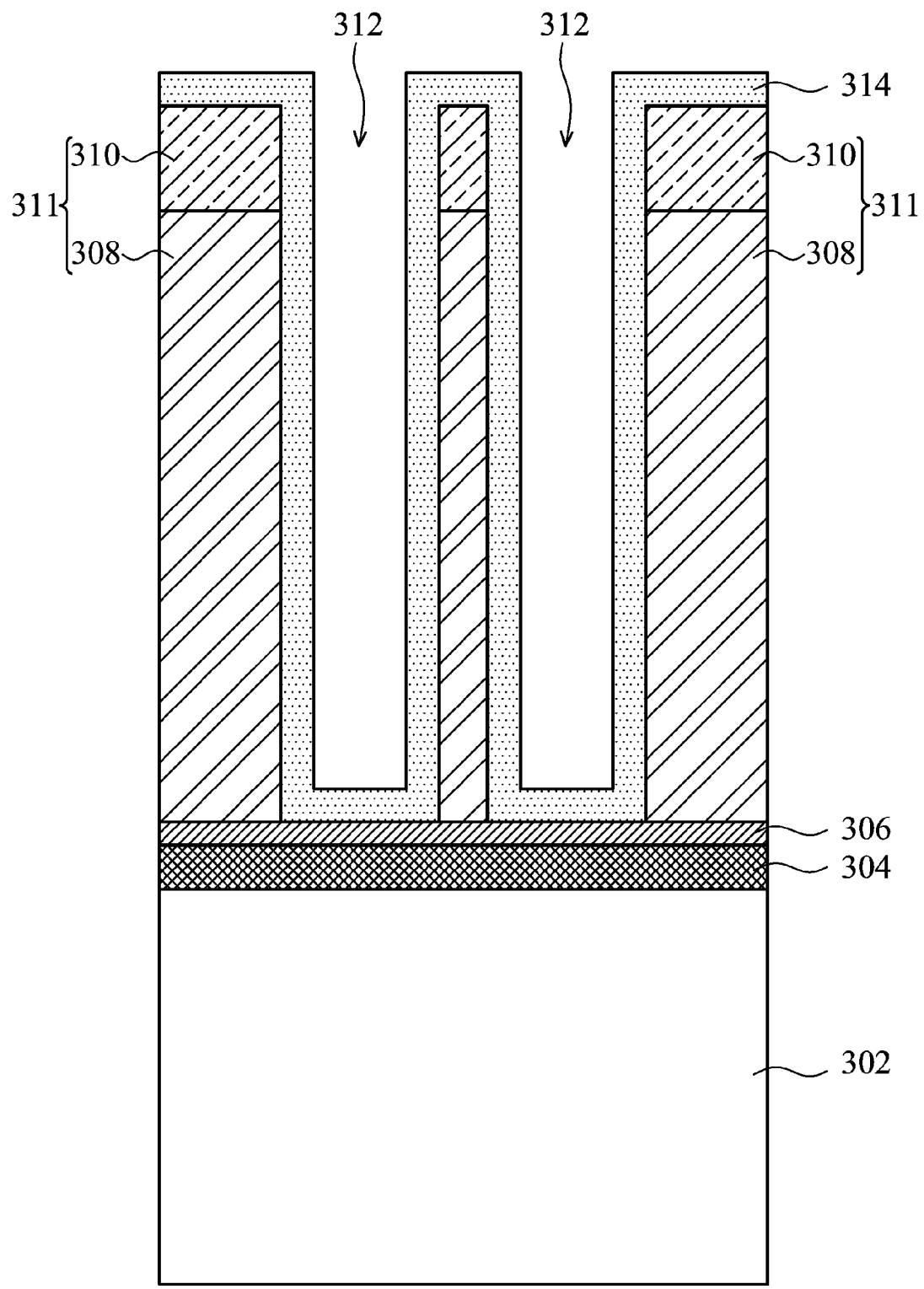
Figure 3D:
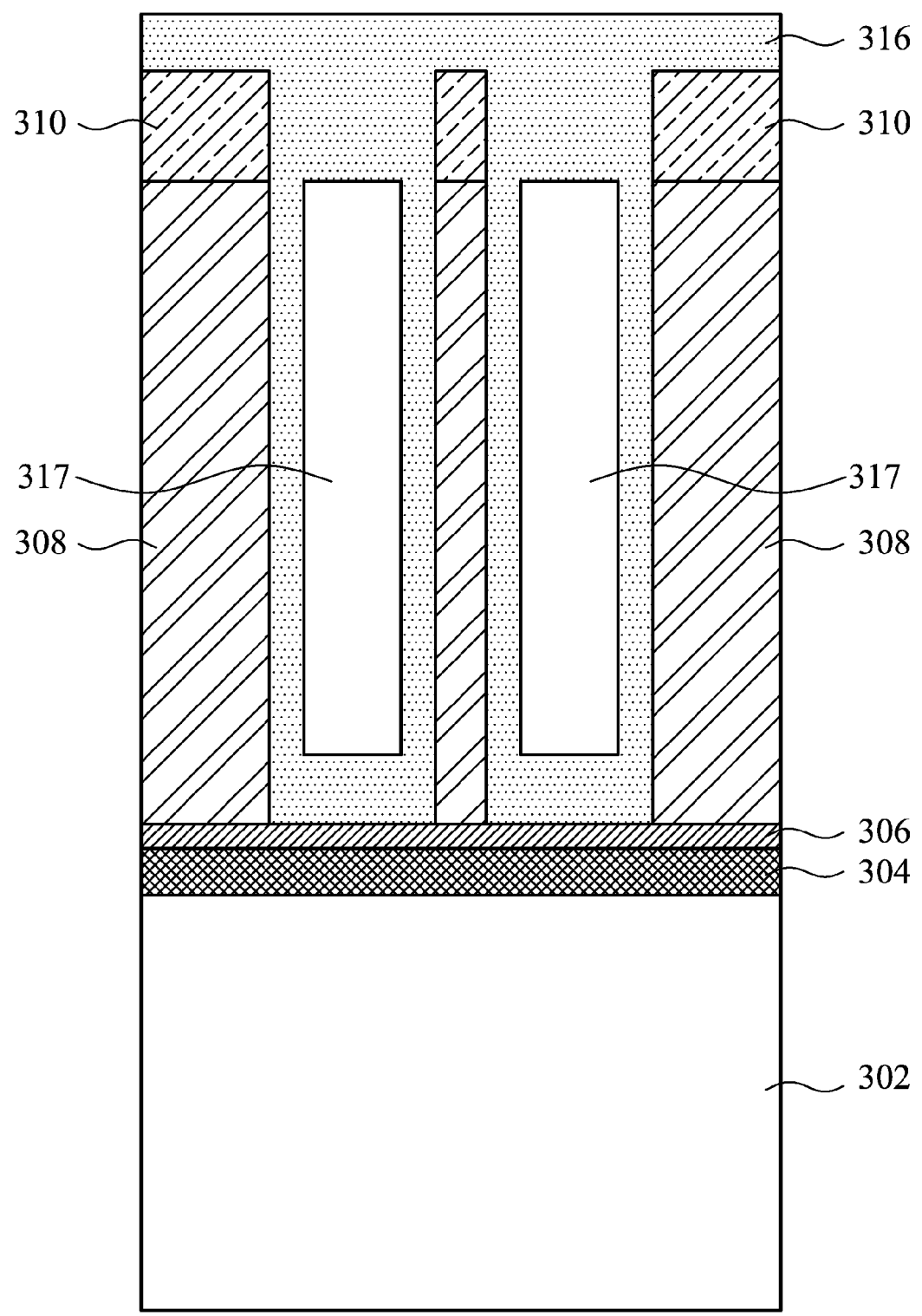
Figure 3E:
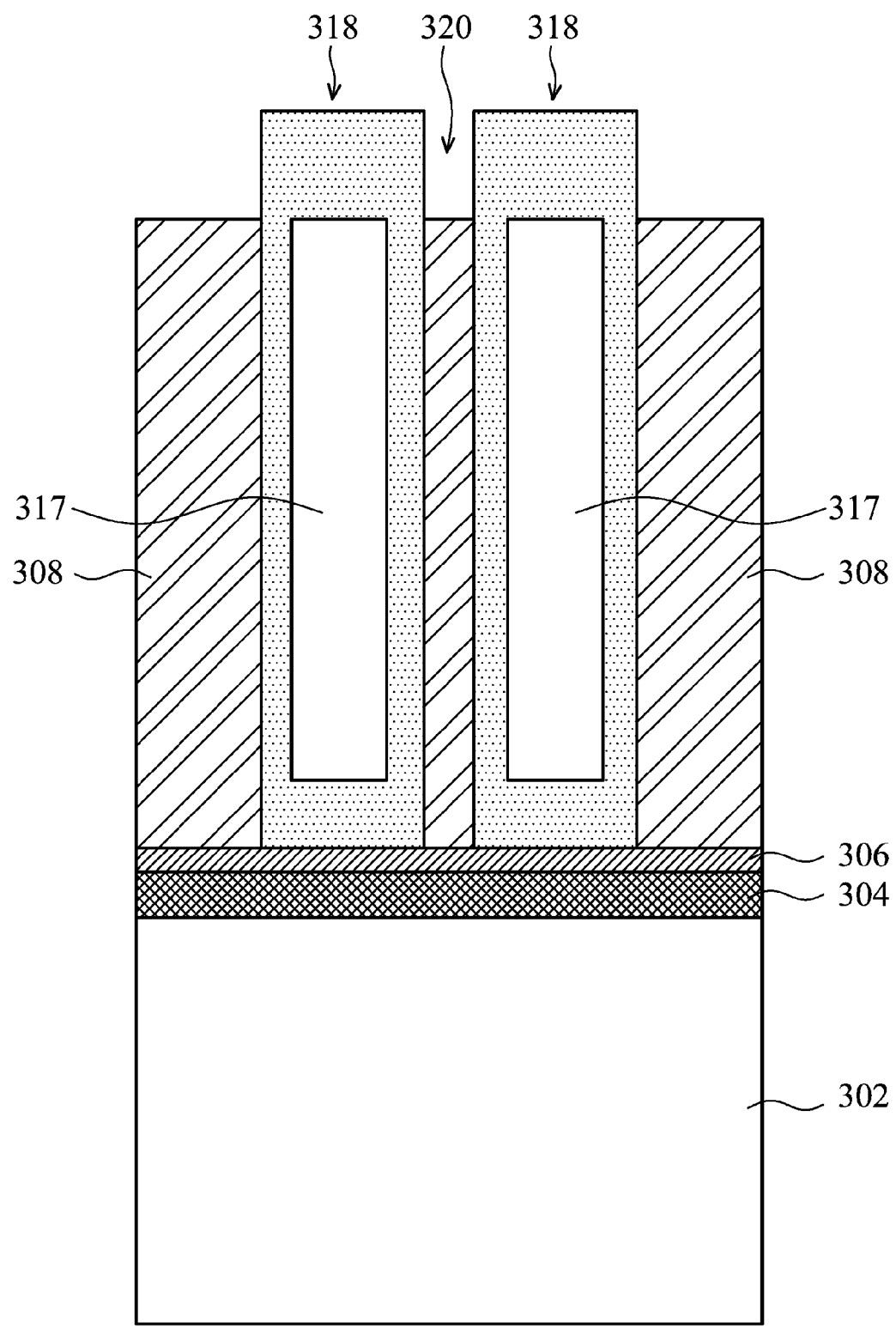
Figure 3F:
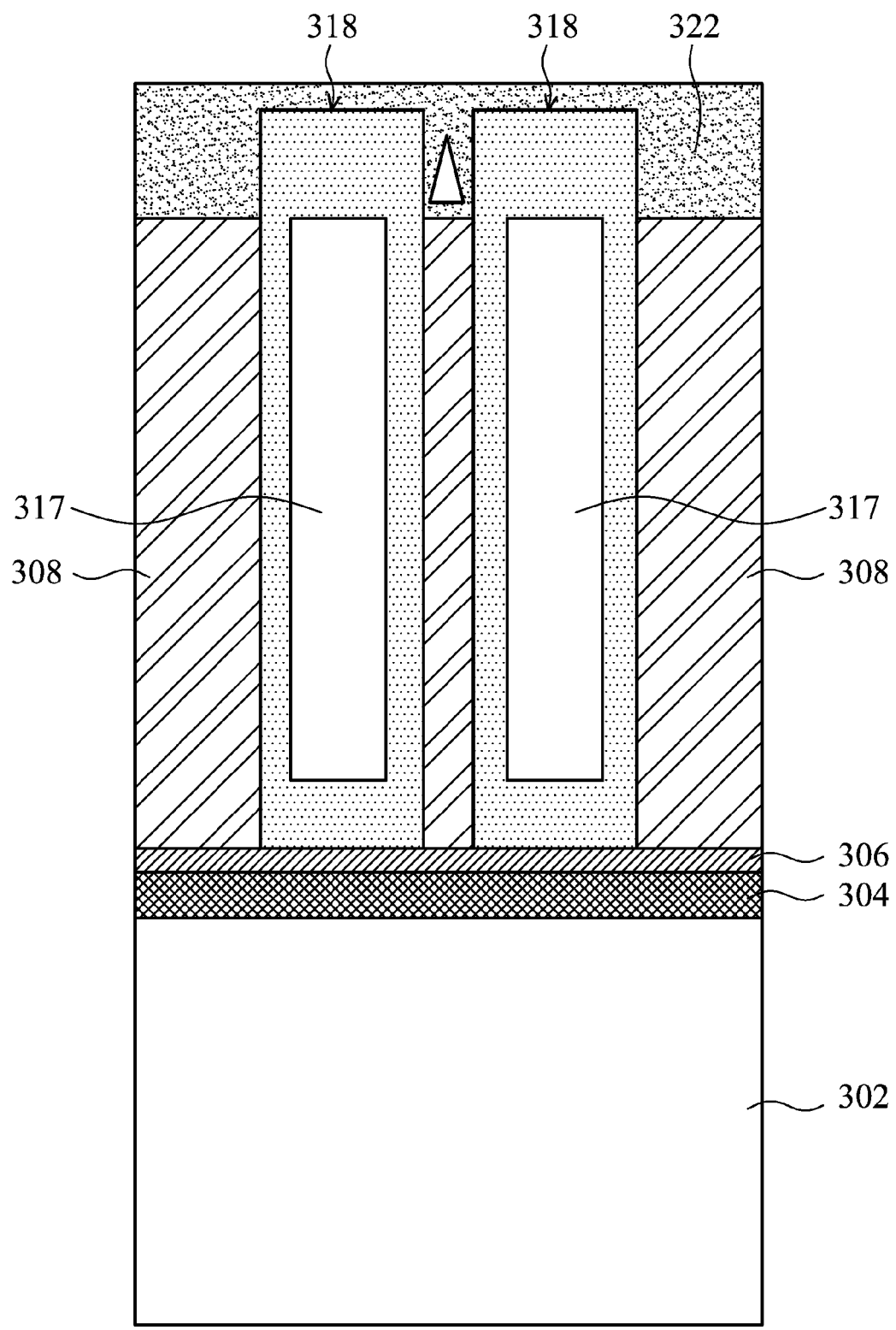
Figure 3G:
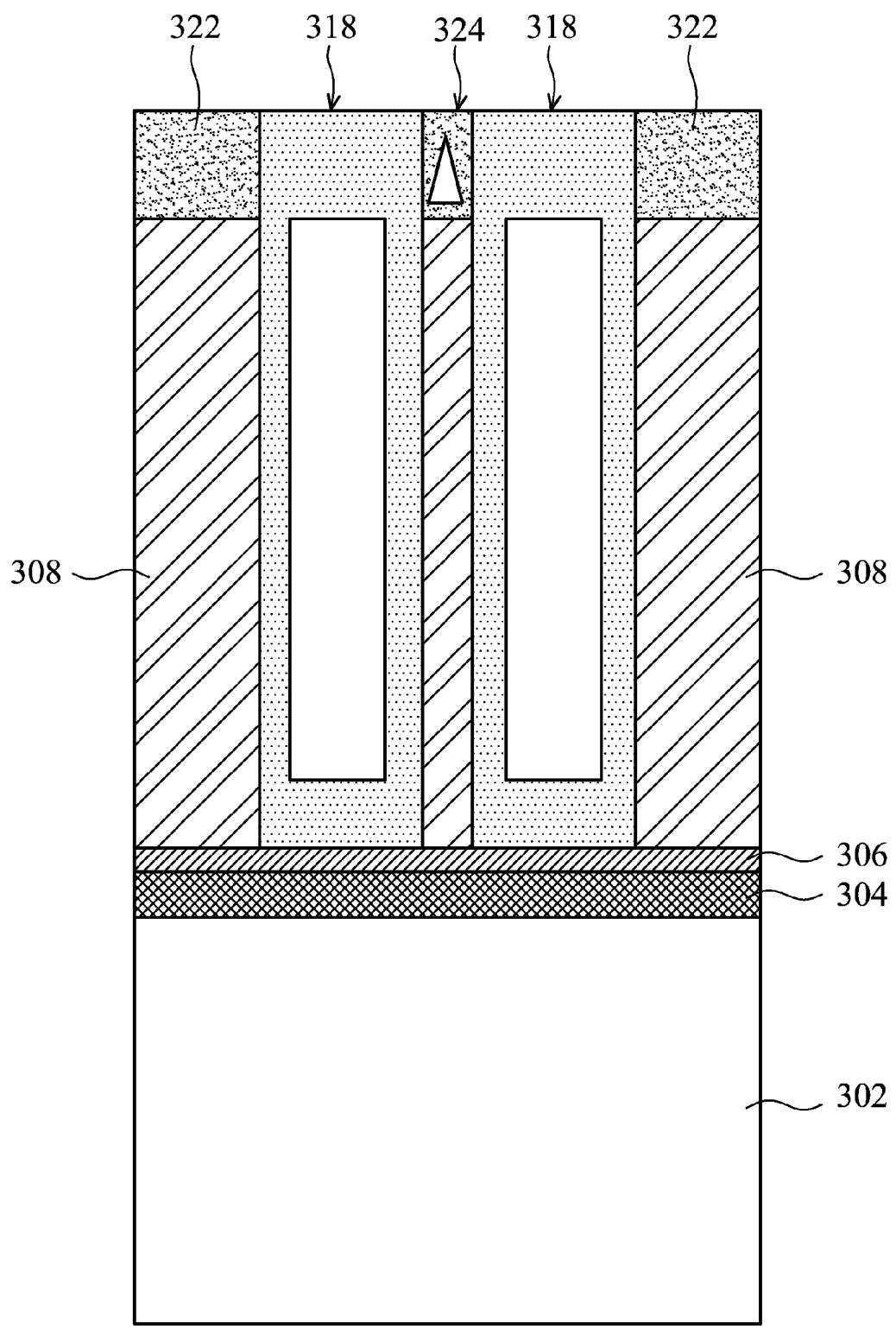
Figure 3H:
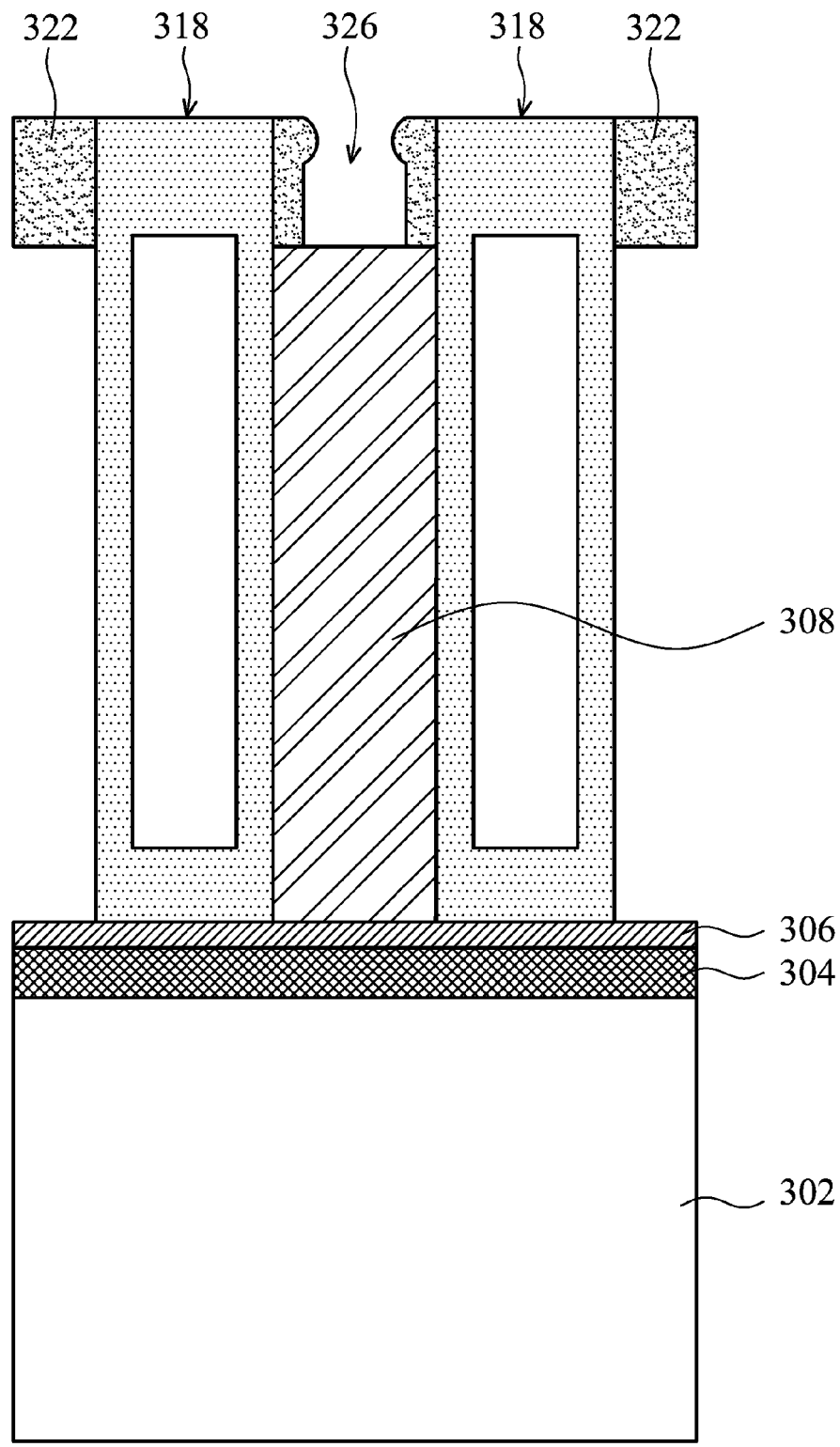
Figure 3I:
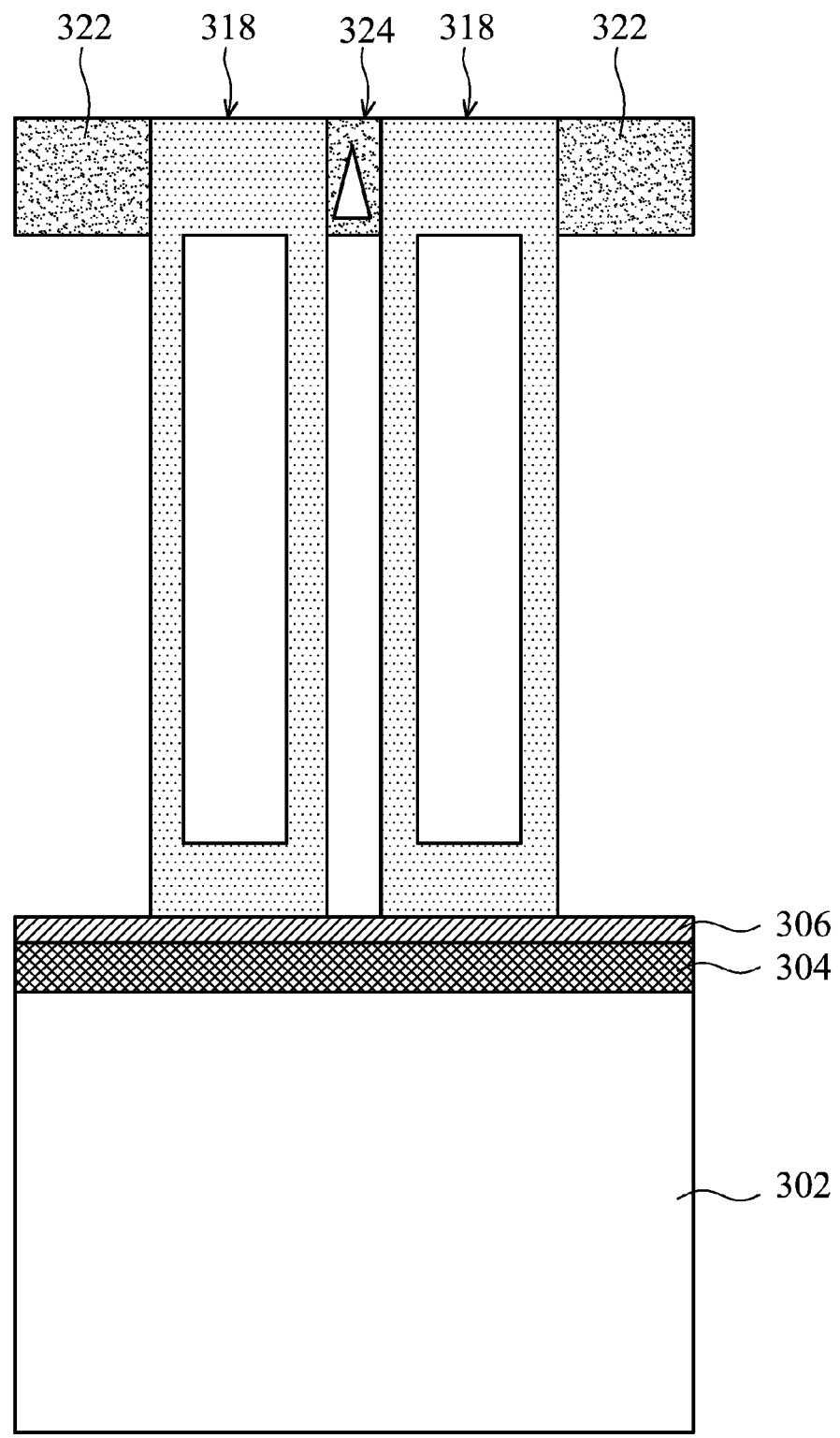
Figure 3J:
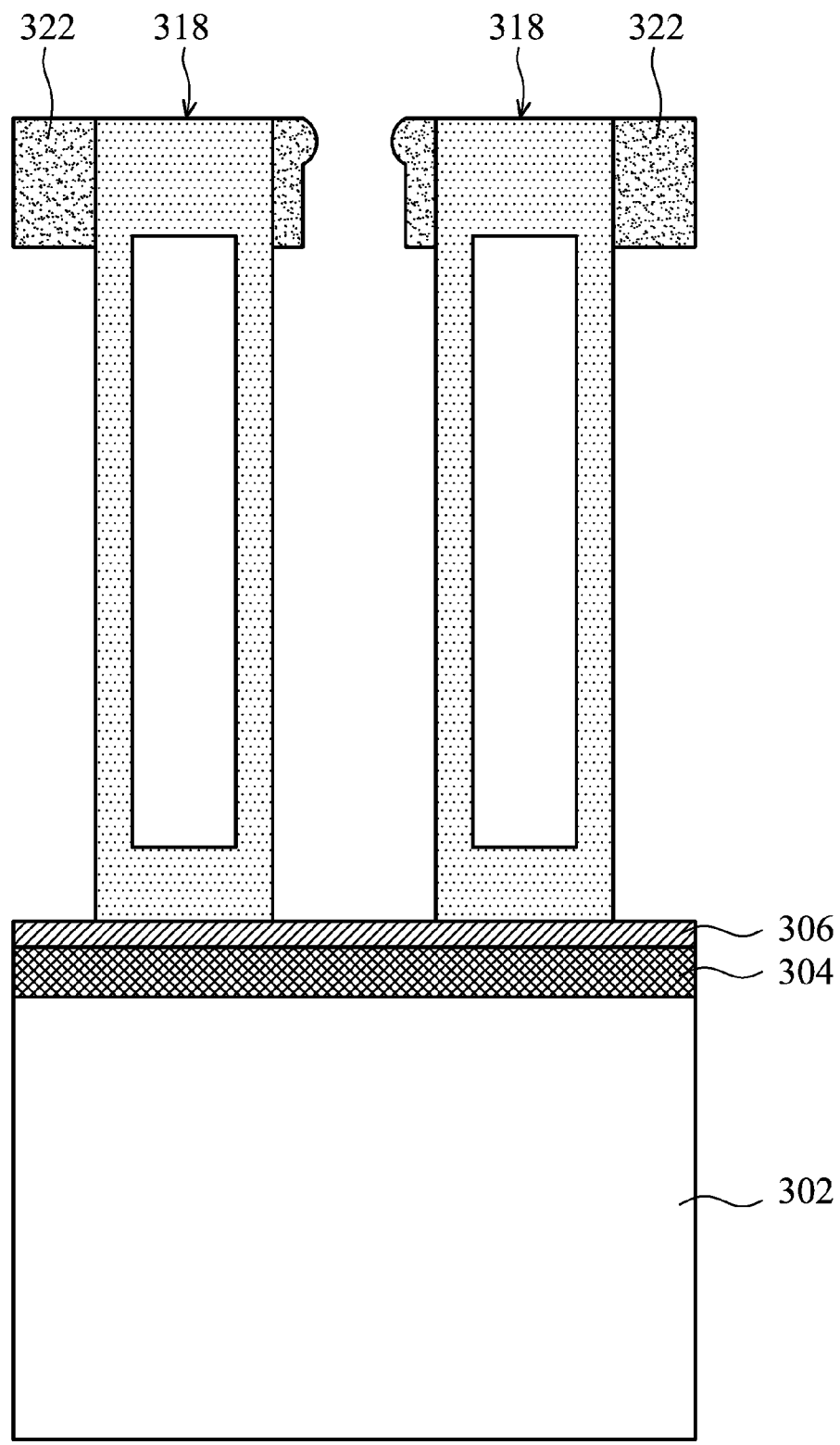
Figure 4:
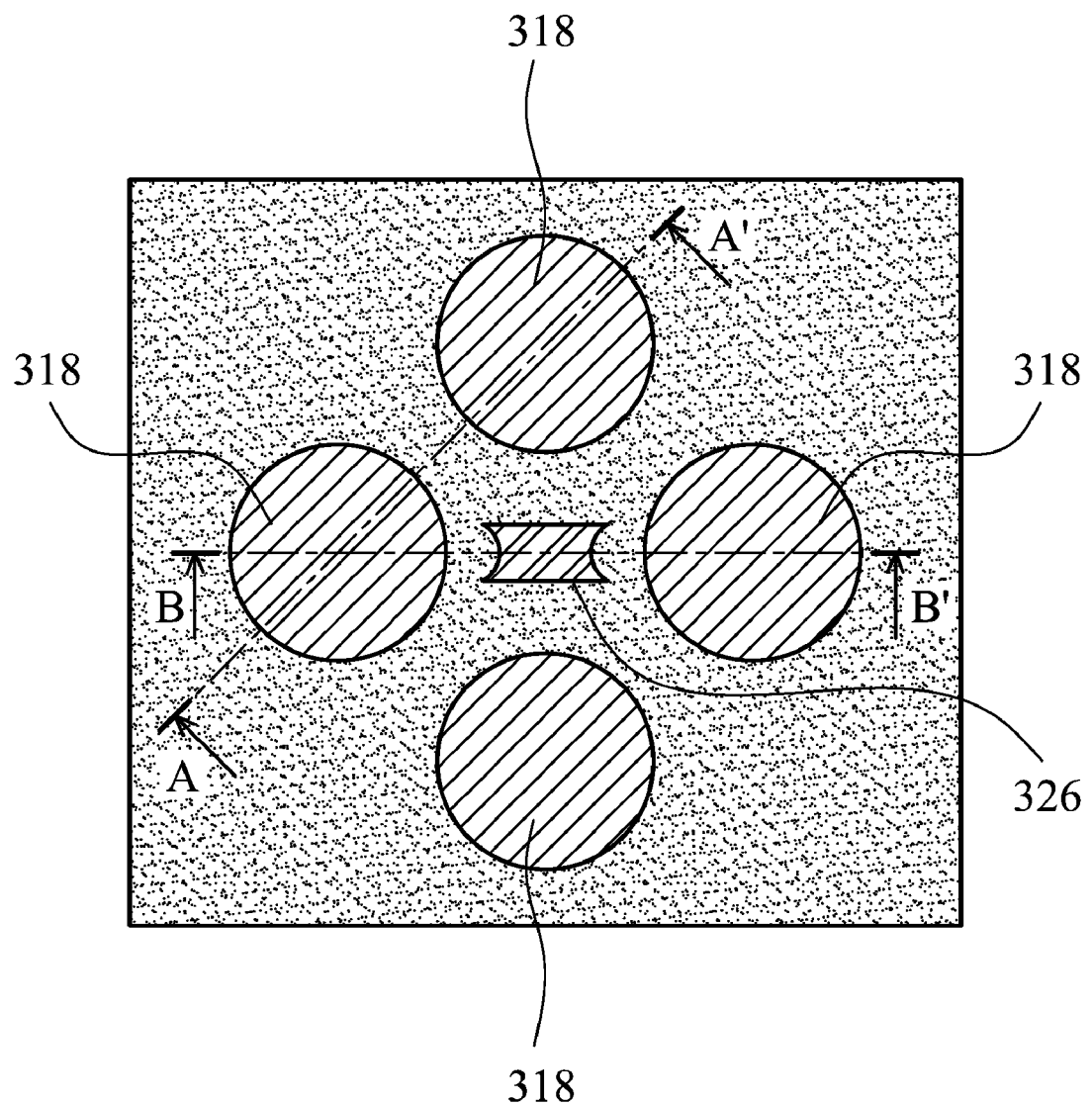
FIG. 4 shows a plan view at the stage when the spacer layer is etched of a memory device of an embodiment of the invention.
Figure 5:
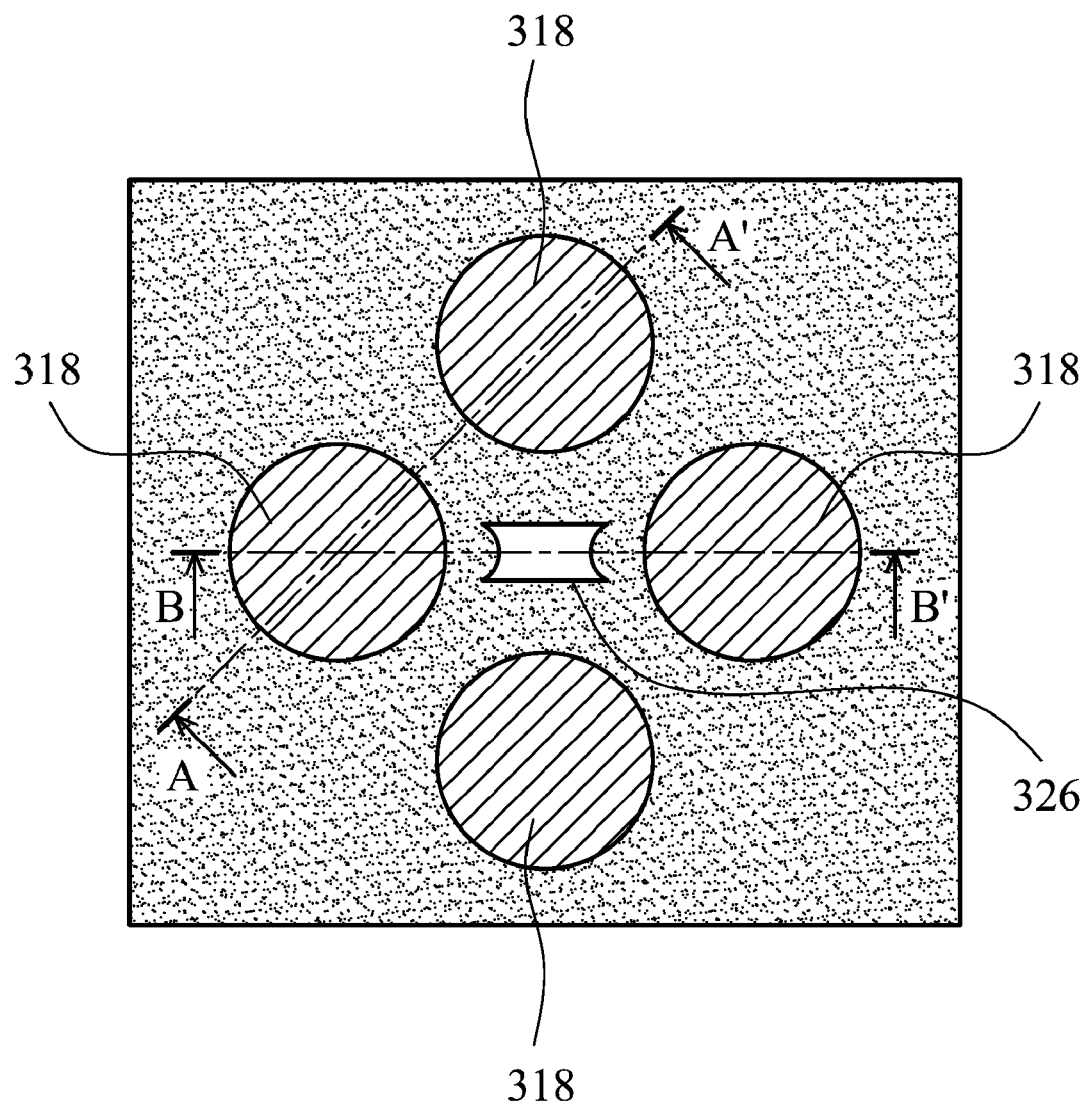
FIG. 5 show a plan view at the stage when the lower sacrificial layer is etched of a memory device of an embodiment of the invention.

Another method for forming stacked capacitors of a memory device is described in accordance with FIG. 3A~FIG. 3J. First, referring to FIG. 3A, a substrate 302 is provided. In the embodiment, the substrate 302 can be a semiconductor and is preferably comprised of silicon. A first dielectric layer 304, preferably a silicon oxide layer, is formed on the substrate 302. A second dielectric layer 306, preferably a silicon nitride layer, is formed on the first dielectric layer 304. A lower sacrificial layer 308, such as a polysilicon layer or an oxide layer, is formed on the second dielectric layer 306. A upper sacrificial layer 310, preferably comprising doped oxide, is formed on the lower sacrificial layer 308. In the embodiment, the combination of the lower sacrificial layer 308 and the upper sacrificial layer 310 can be referred to as a sacrificial layer 311. Referring to FIG. 3B, the lower sacrificial layer 308 and the upper sacrificial layer 310 is patterned by lithography and etching to form a plurality of openings 312. Referring to FIG. 3C, a first conductive layer 314 is conformally formed on the sacrificial layer 311 and in the openings 312. The first conductive layer 314 preferably comprises TiN, W or Ru and is thin, such as 8-10 nm thickness. In addition, the first conductive layer 314 can be formed by atomic layer deposition. Referring to FIG. 3D, a second conductive layer 316 is deposited on the first conductive layer 314. The second conductive layer 316 is preferably formed by a deposition method, wherein the deposited film gathers at the top portion of the openings 312 to seal the openings 312. As shown in FIG. 3D, since the openings are sealed by the second conductive layer 316, a void 317 is formed corresponding to each opening. Also, since the first conductive layer 314 and the second conductive layer 316 are deposited by different deposition methods, the two films have different orientations. Referring to FIG. 3E, a CMP process is performed to remove a portion of the first conductive layer 314 and the second conductive layer 316 exceeding the upper sacrificial layer 310, such that the top surface of the upper sacrificial layer 310 is exposed. Thereafter, the upper sacrificial layer 310 is removed to expose the lower sacrificial layer 308 thereunder and form a plurality of openings 320 between the cylindrical containers 318 and over the lower sacrificial layer 308. Because the upper sacrificial layer 310 comprises silicon oxide, the upper sacrificial layer 310 can be removed by dipping in a solution containing HF. Referring to FIG. 3F, a spacer layer 322, preferably a silicon nitride layer, is formed on the cylindrical containers 318 and filled into the openings 320. Referring to FIG. 3G, FIG. 3H and FIG. 4, wherein FIG. 4 shows a plan view of an etched spacer layer, FIG. 3G shows a cross section along line A-A' of FIG. 4, and FIG. 3H shows a cross section along line B-B' of FIG. 4, the spacer layer 322 is etched to form lattices 324 connecting top portions of adjacent four cylindrical containers 318. Note that a portion of the spacer layer 322 in the center area of the four cylindrical containers 318 can be etched away to form an opening 326, while a portion of the spacer between the adjacent cylindrical containers 318 may be left to form the lattices 324. Referring to FIG. 3I, FIG. 3J and FIG. 5, wherein FIG. 5 shows a plan view of an etched lower sacrificial layer, FIG. 3I shows a cross section along line A-A' of FIG. 5, and FIG. 3J shows a cross section along line B-B' of FIG. 5, the lower sacrificial layer 308 is removed by etching through the opening 326 in the previously formed spacer layer 322 to form bottom cell plates connected by lattices. Like the embodiment illustrated in FIG. 2A-2G, two conductive films are also used to form a bottom cell plate of this embodiment. Thus, a thick conductive layer for forming bottom cell plates is not required to be deposited. Accordingly, wafer bow problems are eliminated and stress related to issues, such as overlay or alignment failure issues, can be reduced. Moreover, the embodiment can have a higher throughput and lower cost.

While the invention has been described by way of example and in terms of the preferred embodiments, it is to be understood that the invention is not limited to the disclosed embodiments. It is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a stack capacitor of a memory device, comprising:
   providing a substrate;
   forming a patterned sacrificial layer with a plurality of first openings over the substrate;
   conformally forming a first conductive layer on the patterned sacrificial layer and in the first openings;
   forming a second conductive layer on the first conductive layer to seal the first openings with a void formed therein;
   removing a portion of the first and second conductive layers to expose the patterned sacrificial layer; and
   removing at least a portion of the patterned sacrificial layer to form bottom cell plates.

2. The method for forming a stack capacitor of a memory device as claimed in claim 1, wherein the step for forming the second conductive layer on the first conductive layer to seal the first openings is performed by physical vapor deposition.

3. The method for forming a stack capacitor of a memory device as claimed in claim 1, further comprising forming a capacitor dielectric layer on the bottom cell plate and forming a third conductive layer on the capacitor dielectric layer.

4. The method for forming a stack capacitor of a memory device as claimed in claim 3, wherein the capacitor dielectric layer is a high k dielectric layer.

5. The method for forming a stack capacitor of a memory device as claimed in claim 4, wherein the high k dielectric layer comprises aluminum oxide ($Al_2O_3$), hafnium oxide ($HfO_2$), hafnium oxynitride (HfON), hafnium silicate ($HfSiO_4$), zirconium oxide ($ZrO_2$), zirconium oxynitride (ZrON), zirconium silicate ($ZrSiO_2$), yttrium oxide ($Y_2O_3$), lanthanum oxide ($La_2O_3$), cerium oxide ($CeO_2$), titanium oxide ($TiO_2$), tantalum oxide ($Ta_2O_5$), or combinations thereof.

6. The method for forming a stack capacitor of a memory device as claimed in claim 1, wherein the first conductive layer, the second conductive layer and the third conductive layer comprise TiN, Ru or W.

7. The method for forming a stack capacitor of a memory device as claimed in claim 1, wherein the patterned sacrificial layer is silicon oxide.

8. The method for forming a stack capacitor of a memory device as claimed in claim 1, wherein the step for forming the first conductive layer is performed by atomic layer deposition.

9. The method for forming a stack capacitor of a memory device as claimed in claim 1, further comprising forming a first dielectric layer and a second dielectric layer on the substrate before forming the patterned sacrificial layer.

10. The method for forming a stack capacitor of a memory device as claimed in claim 9, wherein the first dielectric layer is silicon oxide and the second dielectric layer is silicon nitride.

11. The method for forming a stack capacitor of a memory device as claimed in claim 1, further comprising forming a lattice connecting top portions of neighboring bottom cell plates.

12. The method for forming a stack capacitor of a memory device as claimed in claim 11, wherein the patterned sacrificial layer comprises a polysilicon layer and a doped oxide layer on the polysilicon layer, or the patterned sacrificial layer comprises an oxide layer and a doped oxide layer on the oxide layer.

13. The method for forming a stack capacitor of a memory device as claimed in claim 11, the step for forming the lattice comprises:
    removing the doped oxide layer to form a plurality of second openings;
    forming a spacer layer on the second conductive layer of the bottom cell plates and in the second openings; and
    etching the spacer layer to form the lattice.

14. The method for forming a stack capacitor of a memory device as claimed in claim 13, wherein during the step of etching the spacer layer, at least a portion of the spacer layer is opened to form a plurality of third openings.

15. The method for forming a stack capacitor of a memory device as claimed in claim 14, the step of removing at least a portion of the patterned sacrificial layer comprises removing the polysilicon layer through the third openings.

* * * * *